(12) United States Patent
Filippenko

(10) Patent No.: US 8,373,068 B2
(45) Date of Patent: Feb. 12, 2013

(54) PRECISION SHUNT FOR HIGH SPEED MEASUREMENTS

(75) Inventor: Alexander S. Filippenko, Cary, NC (US)

(73) Assignee: Schneider Electric USA, Inc., Palatine, IL (US)

(*) Notice: Subject to any disclaimer, the term of this patent is extended or adjusted under 35 U.S.C. 154(b) by 579 days.

(21) Appl. No.: 12/625,954

(22) Filed: Nov. 25, 2009

(65) Prior Publication Data

US 2011/0120746 A1    May 26, 2011

(51) Int. Cl.
*H01B 7/00* (2006.01)
*H01R 4/00* (2006.01)

(52) U.S. Cl. .......... 174/113 R; 174/84 R; 174/88 C

(58) Field of Classification Search .......... 174/74 R, 174/74 A, 75 F, 78, 80, 84 R, 88 R, 85, 88, 174/88 C
See application file for complete search history.

(56) References Cited

U.S. PATENT DOCUMENTS

| | | | | |
|---|---|---|---|---|
| 2,502,657 A | * | 4/1950 | Lindenblad | 324/95 |
| 2,634,307 A | * | 4/1953 | Kerns | 324/95 |
| 3,311,856 A | * | 3/1967 | Conney | 333/81 R |
| 3,458,846 A | * | 7/1969 | DeYoung | 338/61 |
| 3,646,440 A | * | 2/1972 | Wilhelm | 324/126 |
| 4,494,068 A | * | 1/1985 | Ley et al. | 324/126 |
| 5,066,904 A | * | 11/1991 | Bullock | 324/127 |
| 5,420,504 A | * | 5/1995 | Berkcan | 324/126 |
| 2007/0115008 A1 | * | 5/2007 | Barth et al. | 324/713 |

* cited by examiner

*Primary Examiner* — Timothy Thompson
*Assistant Examiner* — Nathan Milakovich
(74) *Attorney, Agent, or Firm* — Nixon Peabody LLP

(57) ABSTRACT

A shunt for measuring current passing through a conductor. The shunt includes a first section and a second section connected in series with the conductor, and a coaxial cable connected between the first and second sections. An outer conductor of the first section surrounds an internal conductor having a resistance lower than that of the outer conductor of the first section. An outer conductor of the second section surrounds an internal conductor having a resistance higher than that of the internal conductor of the second section. The dimensions of the first and second sections are the same. An internal conductor of the cable is connected between the two sections, and an outer conductor of the cable is connected to the outer conductors of the two sections. The voltage across the outer and inner conductors of the cable is proportional to the current passing through the conductor.

12 Claims, 1 Drawing Sheet

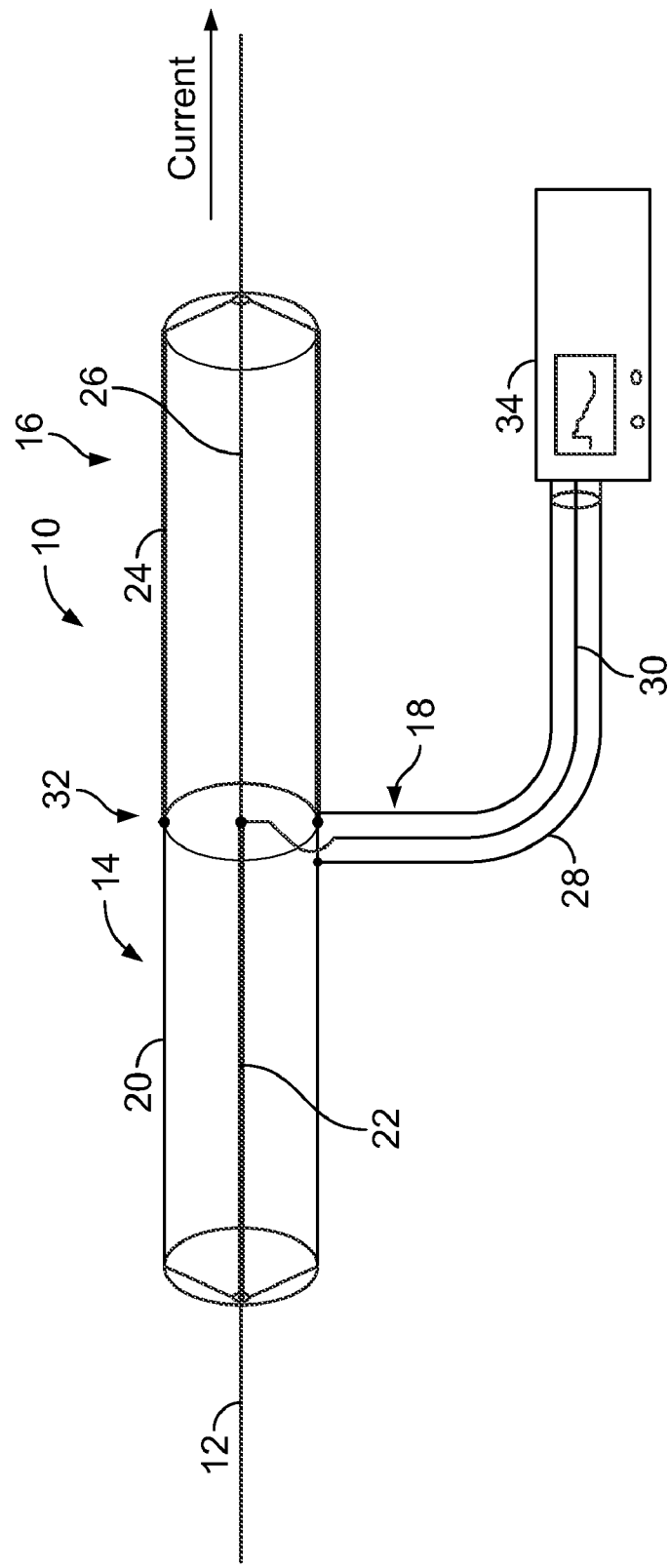

PRECISION SHUNT FOR HIGH SPEED MEASUREMENTS

FIELD OF THE INVENTION

The present disclosure pertains generally to electrical shunts for measuring current, and, more particularly, to a precision shunt for high-speed measurements of rapid electrical events, such as short circuits.

BACKGROUND

Measurements of electrical current during a short circuit arcing condition involves high current and high frequency. A short circuit condition is a high-speed event, so the measurements must be high speed to capture the rapidly changing components of the electrical fault. A classic current transformer is an adequate sensor as long as frequency components of the measured current remain below the range of megahertz. If the frequency components of interest run into the megahertz range, the magnetic losses in the core of the current transformer can significantly distort a signal and its linearity, degrading the precision of the current measurement. A shunt sensor comprising a conductor placed in series with the conductor carrying the electrical current has a better frequency response, but wiring to the sensor is sensitive to external magnetic fields, which can be very strong when a short circuit electrical event occurs. What is needed is a precision shunt that offers full compensation for magnetic field errors. Aspects of the present disclosure address this and other needs.

BRIEF SUMMARY

According to an aspect of the present disclosure, a shunt for high-speed measurements of electrical current, in series with a conductor carrying the electrical current is provided. The shunt includes: a first section having an outer conductor surrounding an internal conductor having a resistance that is lower than the resistance of the outer conductor; a second section abutting the first section and having an outer conductor surrounding an internal conductor having a resistance that is higher than the resistance of the outer conductor, wherein the internal conductors of the first and second sections are connected in series to the conductor carrying the electrical current; and a cable having an outer conductor surrounding an internal conductor, the outer conductor of the cable being connected to the outer conductor of the first section and to the outer conductor of the second section, the internal conductor of the cable being connected to the internal conductor of the first section or between the first and second sections.

The outer conductor and the internal conductor of the first section can be coaxial relative to one another, and the outer conductor and the internal conductor of the second section can be coaxial relative to one another. Corresponding length and cross-sectional dimensions of the first section and the second section can be identical to one another.

The outer conductor of the first section can have a resistance of steel and the internal conductor of the first section can have a resistance of copper. The outer conductor of the second section can have a resistance of copper, and the internal conductor of the second section can have a resistance of steel. The outer conductor of the first section and the internal conductor of the second section can be composed of steel, and the internal conductor of the first section and the outer conductor of the second section can be composed of copper. The cable can be a coaxial cable. The outer conductor of the cable can be connected between the outer conductor of the first section and the outer conductor of the second section.

According to another aspect of the present disclosure, a shunt for measuring electrical current passing through a conductor is provided. The shunt includes: a first coaxial section having an outer conductor surrounding an internal conductor that has a resistance that is lower than the resistance of the outer conductor, the internal conductor of the first coaxial section being connected in series at one end thereof to the conductor carrying the electrical current; a second coaxial section having an outer conductor surrounding an internal conductor that has a resistance that is higher than the resistance of the outer conductor, the internal conductor of the second coaxial section being connected in series at one end thereof to the conductor carrying the electrical current, the other end of the second coaxial section being connected to the other end of the first coaxial section defining an interface therebetween, a cross-sectional and a length dimension of the first coaxial section being identical to a corresponding cross-sectional and length dimension of the second coaxial section; and a coaxial cable having an outer conductor surrounding an internal conductor, the outer conductor of the coaxial cable being connected to the outer conductor of the first section and to the outer conductor of the second section, the internal conductor of the coaxial cable being electrically connected at the interface between the first and second coaxial sections, wherein the voltage potential across the outer and inner conductors of the coaxial cable is proportional to the electrical current passing through the conductor.

The outer conductor of the first coaxial section can have a resistance corresponding to the resistance of steel, and the internal conductor of the first coaxial section can have a resistance corresponding to the resistance of copper, The outer conductor of the second section can have a resistance corresponding to the resistance of copper, and the internal conductor of the second section can have a resistance corresponding to the resistance of steel. The outer conductor of the first coaxial section and the internal conductor of the second coaxial section can be composed of steel, and the internal conductor of the first coaxial section and the outer conductor of the second coaxial section can be composed of copper. The resistance of the internal conductor of the first coaxial section can be substantially the same as the resistance of the outer conductor of the second coaxial section, and the resistance of the outer conductor of the first coaxial section can be substantially the same as the resistance of the internal conductor of the second coaxial section.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

The FIGURE is a cross-sectional view of a precision shunt for making high-speed measurements of electrical current in accordance with an aspect of the present disclosure.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Referring to the FIGURE, a shunt 10 or current sensor for making high-speed measurements of electrical current is shown in series with a conductor 12 carrying the electrical current. The shunt 10 includes a first section 14, a second section 16 abutting the first section in a series electrical relation at an interface 32, and a coaxial cable 18. The first section 14 has an outer conductor 20 surrounding an internal conductor 22, which has a resistance that is lower than the resistance of the outer conductor 20. The outer conductor 20 and the internal conductor 22 are coaxial relative to one another as shown in the FIGURE. The second section 16 has an outer conductor 24 surrounding an internal conductor 26, which has a resistance that is higher than the resistance of the outer conductor 24 of the second section 16. The outer conductor 24 and the internal conductor 26 are coaxial relative to one another as shown in the FIGURE. The internal conductor 22 of the first section 14 and the internal conductor 26 of the second section 16 are connected in series to the conductor 12 carrying the electrical current. Specifically, the internal conductor 22 of the first section 14 is connected in series at one end thereof to the conductor 12, and the internal conductor 26 of the second section 16 is connected in series at one end thereof to the conductor 12. The other corresponding ends of the first and second sections 14, 16 are joined to define the interface 32 therebetween. The dimensions of the first section 14 and the second section 16 are identical such that they have the same length and cross-sectional area. In other words, the length dimension of the first section 14 is substantially identical to the length dimension of the second section 16, and the cross-sectional area of the first and second sections 14, 16 is substantially identical.

The outer conductor 20 of the first section 14 has a resistance corresponding to the resistance of steel, and the internal conductor 22 of the first section has a resistance corresponding to the resistance of copper. By contrast, the outer conductor 24 of the second section 16 has a resistance corresponding to the resistance of copper, and the internal conductor 26 has a resistance corresponding to the resistance of steel. The outer conductor 20 and the internal conductor 26 can be composed of steel, whereas the internal conductor 22 and the outer conductor 24 can be composed of copper. In this symmetrical bridge configuration, at the interface 32 where the first and second sections 14, 16 are joined, a voltage is developed that is proportional to the electrical current passing through the conductor 12. This voltage is free of noise produced by magnetically induced components, which are self-compensated by the symmetric bridge configuration of the first and second sections 14, 16. The coaxial configuration of the corresponding internal and outer conductors of the first and second sections 14, 16 also operates to neutralize the influence of magnetic fields induced by the electrical current passing through the conductor 12.

The coaxial cable 18 has an outer conductor 28 surrounding an internal conductor 30. The outer conductor 28 of the coaxial cable 18 is connected to the outer conductor 20 of the first section 14 and to the outer conductor 24 of the second section 16. The internal conductor 30 of the coaxial cable 18 is connected to the internal conductor 22 of the first section 14 or between the first section 14 and the second section 16. In other words, the internal conductor 30 of the coaxial cable 18 is connected where the two sections 14, 16 join and abut each other. At this junction, the internal conductor 30 of the cable can be connected to the internal conductor 22 of the first section 14 or to the internal conductor 26 of the second section 16 or to both. The outer conductor 28 of the coaxial cable 18 is connected to the outer conductor 20 of the first section 14 and to the outer conductor 24 of the second section 16 at the interface 32 where the first and second sections 14, 16 are connected. The voltage potential across the outer conductor 28 and the internal conductor 30 of the cable 18 is proportional to the electrical current passing through the conductor 12.

The cable 18 is connected to measurement circuitry 34 (such as a data logger or scope), which analyzes the electrical current and the high frequency components of the electrical current passing through the conductor 12 for characterizing an electrical fault, such as a short circuit, or any other electrical event. The cable 18 can be a coaxial cable, preferably shielded. Alternately, the cable 18 can be, for example, a twisted pair (shielded or not shielded) cable to help with a common-mode signal rejection while transferring the signal from the shunt 10 to the data logger or scope 34.

The shunt 10 is effectively a resistive sensor that senses an electrical current passing through the conductor 12 and produces a voltage that is proportional to the electrical current from which the electrical current can be readily extrapolated using Ohm's Law. Advantageously, the high frequency components of the electrical current are preserved without distortion due to noise generated by magnetic fields for sensing, analysis, and characterization of electrical faults and events.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A shunt for measuring electrical current, in series with a conductor carrying the electrical current, comprising:
   a first section having an outer conductor surrounding an internal conductor having a resistance that is lower than the resistance of the outer conductor;
   a second section abutting the first section and having an outer conductor surrounding an internal conductor having a resistance that is higher than the resistance of the outer conductor of the second section, wherein the internal conductors of the first and second sections are connected in series to the conductor carrying the electrical current; and
   a cable having an outer conductor surrounding an internal conductor, the outer conductor of the cable being connected to the outer conductor of the first section and to the outer conductor of the second section, the internal conductor of the cable being connected to the internal conductor of the first section or between the first and second sections.

2. The shunt of claim 1, wherein the outer conductor and the internal conductor of the first section are coaxial relative to one another, and the outer conductor and the internal conductor of the second section are coaxial relative to one another.

3. The shunt of claim 1, wherein corresponding length and cross-sectional dimensions of the first section and the second section are identical.

4. The shunt of claim 1, wherein the outer conductor of the first section has a resistance of steel and the internal conductor of the first section has a resistance of copper, and wherein the outer conductor of the second section has a resistance of copper and the internal conductor of the second section has a resistance of steel.

5. The shunt of claim 4, wherein the outer conductor of the first section and the internal conductor of the second section include steel, and wherein the internal conductor of the first section and the outer conductor of the second section include copper.

6. The shunt of claim 1, wherein the cable is a coaxial cable.

7. The shunt of claim 1, wherein the outer conductor of the cable is connected between the outer conductor of the first section and the outer conductor of the second section.

8. A shunt for measuring electrical current passing through a conductor, comprising:
   a first coaxial section having an outer conductor surrounding an internal conductor that has a resistance that is lower than the resistance of the outer conductor, the internal conductor of the first coaxial section being connected in series at one end thereof to the conductor carrying the electrical current;
   a second coaxial section having an outer conductor surrounding an internal conductor that has a resistance that is higher than the resistance of the outer conductor of the second coaxial section, the internal conductor of the second coaxial section being connected in series at one end thereof to the conductor carrying the electrical current, the other end of the second coaxial section being connected to the other end of the first coaxial section defining an interface therebetween, a cross-sectional and a length dimension of the first coaxial section being identical to a corresponding cross-sectional and length dimension of the second coaxial section; and
   a coaxial cable having an outer conductor surrounding an internal conductor, the outer conductor of the coaxial cable being connected to the outer conductor of the first section and to the outer conductor of the second section, the internal conductor of the coaxial cable being electrically connected at the interface between the first and second coaxial sections, wherein the voltage potential across the outer and inner conductors of the coaxial cable is proportional to the electrical current passing through the conductor.

9. The shunt of claim 8, wherein the outer conductor of the first coaxial section has a resistance corresponding to the resistance of steel and the internal conductor of the first coaxial section has a resistance corresponding to the resistance of copper, and wherein the outer conductor of the second section has a resistance corresponding to the resistance of copper and the internal conductor of the second section has a resistance corresponding to the resistance of steel.

10. The shunt of claim 9, wherein the outer conductor of the first coaxial section and the internal conductor of the second coaxial section include steel, and wherein the internal conductor of the first coaxial section and the outer conductor of the second coaxial section include copper.

11. The shunt of claim 1, wherein the resistance of the internal conductor of the first coaxial section is substantially the same as the resistance of the outer conductor of the second coaxial section, and the resistance of the outer conductor of the first coaxial section is substantially the same as the resistance of the internal conductor of the second coaxial section.

12. The shunt of claim 1, wherein the cable is a twisted-pair cable.

* * * * *